(12) United States Patent
Kim

(10) Patent No.: US 6,370,064 B1
(45) Date of Patent: Apr. 9, 2002

(54) METHOD OF OPERATING SPLIT GATE-TYPED NON-VOLATILE MEMORY CELL AND SEMICONDUCTOR MEMORY DEVICE HAVING THE CELLS

(75) Inventor: Jin-Woo Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/383,491

(22) Filed: Aug. 26, 1999

(30) Foreign Application Priority Data

Aug. 27, 1998 (KR) .......................................... 98-34948

(51) Int. Cl.⁷ ............................................. G11C 11/34
(52) U.S. Cl. ............................. 365/185.29; 365/185.27
(58) Field of Search ....................... 365/185.29, 185.27, 365/185.28

(56) References Cited

U.S. PATENT DOCUMENTS

| | | | |
|---|---|---|---|
| 5,029,130 A | 7/1991 | Yeh | 365/185 |
| 5,045,488 A | 9/1991 | Yeh | 437/43 |
| 5,122,985 A | 6/1992 | Santin | 365/185 |
| 5,440,518 A | 8/1995 | Hazani | 365/218 |
| 5,455,792 A | 10/1995 | Yi | 365/185.12 |
| 5,583,810 A | 12/1996 | Van Houdt et al. | 365/185.15 |
| 5,598,369 A | 1/1997 | Chen et al. | 365/185.27 |
| 5,614,746 A | 3/1997 | Hong et al. | 257/316 |
| 5,625,600 A | 4/1997 | Hong | 365/218 |
| 5,636,162 A | 6/1997 | Coffman et al. | 365/185.22 |
| 5,659,504 A | 8/1997 | Bude et al. | 365/185.27 |
| 5,681,770 A | 10/1997 | Ogura et al. | 437/43 |
| 5,691,937 A | 11/1997 | Ohta | 365/185.01 |
| 5,703,387 A | 12/1997 | Hong | 257/315 |
| 5,748,538 A | 5/1998 | Lee et al. | 365/185.06 |
| 5,773,861 A | 6/1998 | Chen et al. | 257/316 |
| 5,783,473 A | 7/1998 | Sung | 438/265 |
| 5,808,944 A | * 9/1998 | Yoshitake | 365/200 |
| 5,844,271 A | 12/1998 | Sethi et al. | 257/318 |
| 5,856,688 A | 1/1999 | Lee et al. | 257/295 |
| 5,867,426 A | 2/1999 | Ahn et al. | 365/185.18 |
| 5,883,409 A | 3/1999 | Guterman et al. | 257/316 |

\* cited by examiner

*Primary Examiner*—A. Zarabian
(74) *Attorney, Agent, or Firm*—Myers Bigel Sibley & Sajovec

(57) ABSTRACT

Methods of operating non-volatile memory cells (e.g., EEPROM devices) include the use of negative substrate biases during programming and erasing operations. Theses methods include the step of erasing the memory cell by withdrawing negative charge from a floating gate therein using a positive control electrode bias and a negative substrate bias. The use of a negative substrate bias increases the potential difference between the control electrode and the floating gate and this increase results in faster and more reliable erasing. A step is also performed to program the memory cell by accumulating negative charge on the floating gate using a positive control electrode bias, a negative substrate bias and a positive drain bias. Here, the negative substrate bias is used advantageously to reduce the likelihood that non-selected memory cells will become inadvertently programmed during operations to program selected memory cells.

6 Claims, 7 Drawing Sheets

METHOD OF OPERATING SPLIT GATE-TYPED NON-VOLATILE MEMORY CELL AND SEMICONDUCTOR MEMORY DEVICE HAVING THE CELLS

BACKGROUND OF THE INVENTION

1. Field of the Invention

The present invention relates to a method of operating a split gate type of non-volatile memory cell and a semiconductor memory device having the cells, and more particularly, to a method of operating a split gate type of non-volatile memory cell overcoming the problems of the program disturbance and endurance characteristics and a method of operating a semiconductor memory device including the cells.

2. Discussion of Related Art

The split gate type of non-volatile memory cell is known in U.S. Pat. No. 5,045,488 entitled "method of manufacturing a single transistor non-volatile semiconductor device" and U.S. Pat. No. 5,029,130 entitled "single transistor non-volatile alterable semiconductor memory device". Methods of programming memory cells having floating gate electrodes are disclosed in U.S. Pat. No. 5,659,504 to Bude et al.

Figure 1:
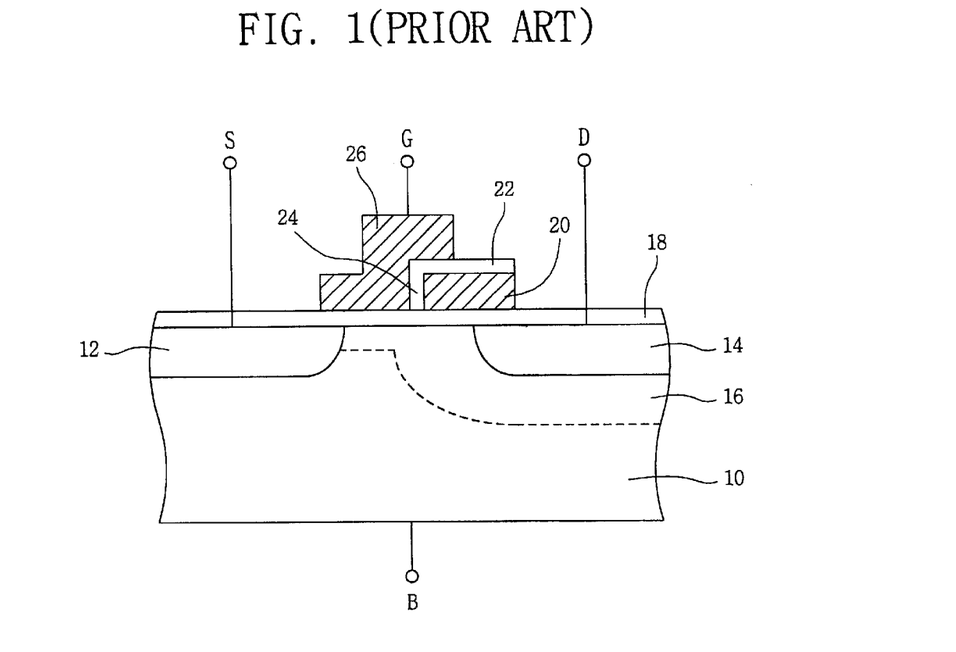
FIG. 1 illustrates the structure of a conventional split gate type of non-volatile memory cell.

FIG. 1 illustrates the structure of a conventional split gate type of non-volatile memory cell in U.S. Pat. Nos. 5,045,488 and 5,029,130.

A source 12 and a drain 14 are formed on a semiconductor substrate 10. Between the source 12 and drain 14 is formed a channel 16. An insulating layer 18 is formed on the source 12, channel 16 and drain 14. A floating gate 20 is formed on a predetermined portion of the insulating layer 18 on the channel 16 and drain 12. Other insulating layer 22 is formed on the floating gate 20. Another insulating layer 24 is formed to be insulated from a control gate 26. The control gate 26 is formed on a predetermined portion of the insulating layer 24 and the insulating layer 18 on the source 12 and channel 16.

The operation of the split gate type of non-volatile memory cell of FIG. 1 is described with reference to FIGS. 2 to 4.

Figure 2:
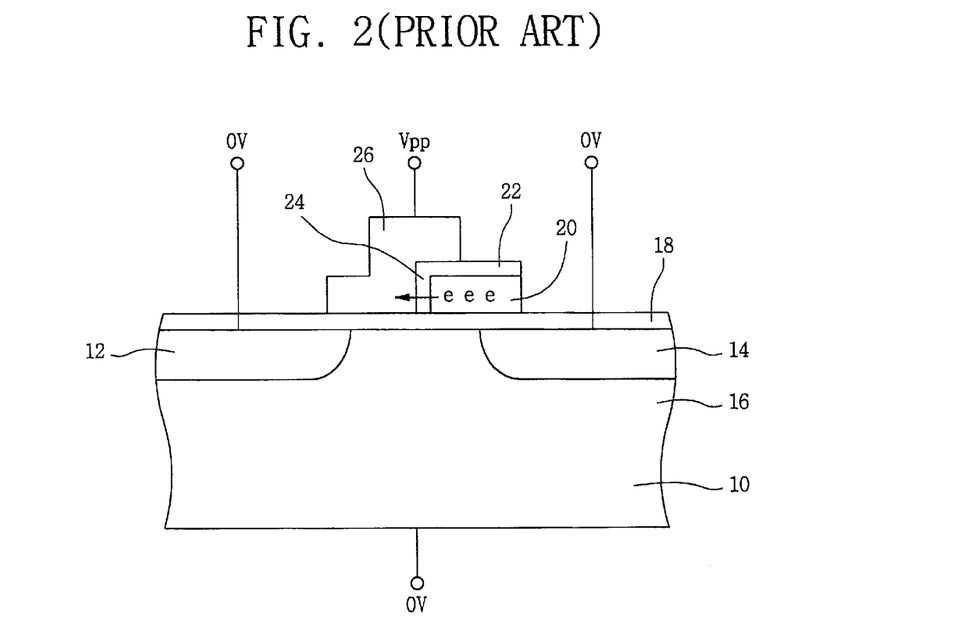
FIG. 2 illustrates a method of erasing the conventional split gate type of non-volatile memory cell.

FIG. 2 illustrates a method of erasing the split gate type of non-volatile memory cell of FIG. 1. In the drawing, the source 12 and drain 14 receive the same voltage 0V, and the control gate 26 receives the voltage Vpp higher than that applied to the source 12 and drain 14. Here, an intensive coupling from the floating gate 20 to the substrate 10 and drain 14 decreases a voltage of the floating gate 20. This kind of voltage decrease allows electrons to flow from the floating gate 20 to the control gate 26 by an F-N (Fowler-Nordheim) tunneling mechanism. Accordingly, an erasing function is ascribed to the electron of the floating gate 20 moving to the control gate 26. Through the erasing operation, the floating gate 20 is charged with (+). That is, the erasing operation is performed by the voltage difference between the floating gate 20 and the control gate 26.

Figure 3:
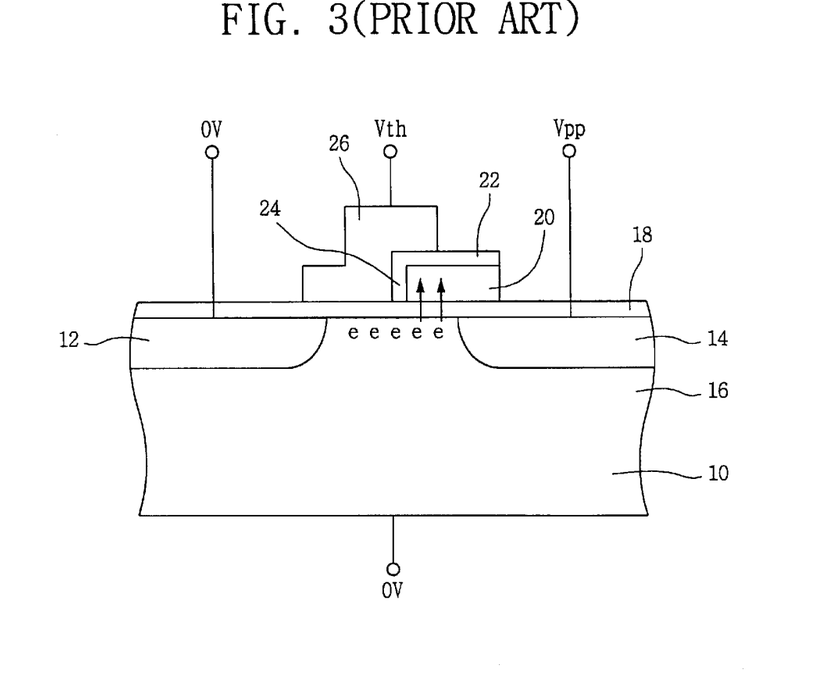
FIG. 3 illustrates a method of programming the conventional split gate type of non-volatile memory cell.

FIG. 3 illustrates a method of programming the split gate type of non-volatile memory cell of FIG. 1. A threshold voltage Nth is applied to the control gate 26. A high voltage Vpp is applied to the drain 14. "0" voltage is applied through the source 12 to the substrate 10, and thus the programming is performed.

If the high voltage Vpp is applied to the drain, the potential of the floating gate 20 is raised and the channel under the floating gate 20 is turned on. The threshold voltage Vth is applied to the control gate 26 and accordingly the channel under the control gate 26 is lightly turned on. Accordingly, electrons flow from the source 12 to drain 14. These electrons are charged in the floating gate 20 via the insulating layer 18 because of the static electricity of the floating gate 20, thus performing the programming operation. Hence, the floating gate 20 is (−)-charged and programmed to "0".

In other words, the programming operation is performed in such a manner that a high voltage Vpp is applied to the drain of the memory cell to thereby bring the floating gate 20 to a predetermined voltage, and a predetermined voltage (a threshold voltage Vth of a transistor made of the control gate and the channel) is applied to the control gate 26 so that hot channel electrons generated when the current flows between the source 12 and drain 14 are injected into the floating gate.

Figure 4:
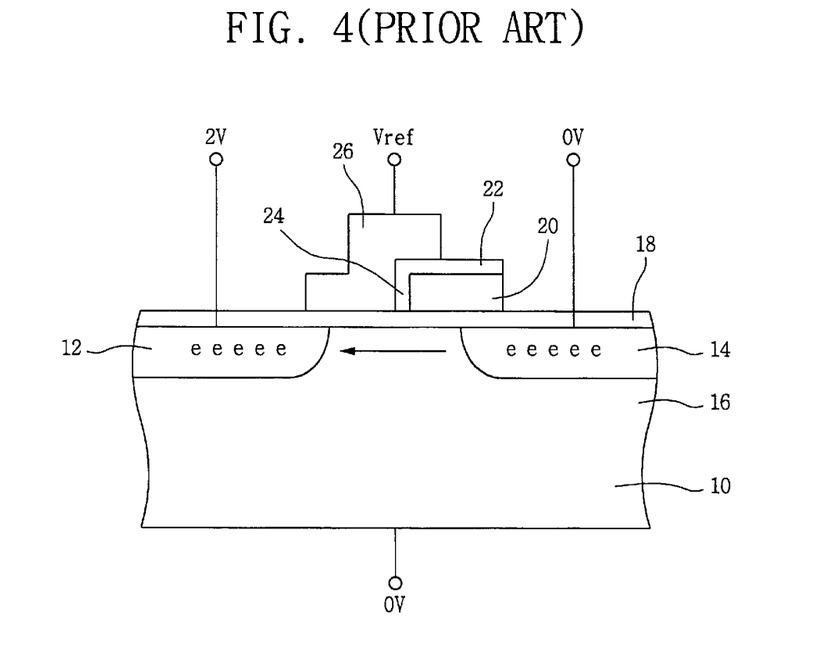
FIG. 4 illustrates a method of reading the conventional split gate type of non-volatile memory cell.

FIG. 4 illustrates a method of reading the conventional split gate type of non-volatile memory cell of FIG. 1. A reference voltage Vref is applied to the control gate 26; 0V to the drain 14, 2V to the source 12, and 0V to the substrate 10, thus performing the reading operation.

If the floating gate 20 is charged with (+), the channel 16 right under the floating gate 20 is turned on. If the voltage of the control gate 26 is raised to the reference voltage Vref for turning on the channel under the control gate 26, electrons may flow from the drain 14 to the source 12, and thereby reading the data of "1".

On the contrary, if the floating gate 20 is charged with (−), the channel right under the floating gate 20 is slightly turned on or off. A voltage level of the control gate 26 and the source 12 is raised to that of the read voltage so as to turn on the channel under the control gate 26. Hence, the current cannot flow through the channel, thereby reading the data of "0".

In other words, if the floating gate 20 is charged with (+), the current is generated through the channel 16 to thereby read the data of "1", and on the contrary, if the floating gate 20 is charged with (−), the current does not flow through the channel 16, thereby reading the data of "0".

Therefore, the data is read by checking if the current flows through the memory cell or not by applying a predetermined voltage to the source 14 and the control gate 26. For this reason, if to perform the reading operation, the channels should be formed through the control gate and floating gate so that the current flows through the cell.

But, in the semiconductor memory device including the thus-structured split gate type of non-volatile memory cells, a threshold voltage Vth should be applied to the word line of a selected cell; 0V to the word line of a non-selected cell; 0V to the bit line of a selected cell; power voltage Vcc to the bit line of a non-selected cell; high voltage Vpp to the drain of a selected cell; and 0V to the drain of a non-selected cell should be respectively applied in order to generate current between the source and drain, thereby performing the programming operation. Within the programming condition, if the non-selected cell including the drain commonly connected to the drain of a selected cell is erased, the high voltage Vpp is applied to the drain of a non-selected cell, the floating gate being charged with (+), the source receiving 0V, and the substrate receiving 0V. Here, the control gate and source receive 0V, but the channel is formed by the punch through phenomenon and the current flows. The electrons conducted in the channel are injected into the floating gate, and thus programmed. Consequently, an ON-cell becomes an OFF-cell, thus causing the program interference problem.

In addition, the semiconductor memory device including the conventional split gate-typed memory cells repeatedly performs the programming and erasing operations. In the erasing operation, electrons of the floating gate should completely go out towards the control gate. But, they are trapped within the tunneling insulating layers. Consequently, the threshold voltage increases in accordance with the increasing number of operations, thus causing the problem of endurance characteristics.

SUMMARY OF THE INVENTION

It is therefore an object of the present invention to provide improved methods of operating non-volatile memory devices.

It is another object of the present invention to provide methods of operating non-volatile memory devices that enhance the endurance characteristics of memory cells therein.

It is still another object of the present invention to provide methods of operating non-volatile memory devices that increase the reliability and speed of programming and erasing operations.

It is still a further object of the present invention to provide methods of operating non-volatile memory devices that reduce the likelihood of programming interference between selected and non-selected memory cells.

Theses and other objects, advantages and features of the present invention are provided by preferred methods of operating non-volatile memory cells (e.g., EEPROM cells) that include the use of negative substrate biases during programming and erasing operations. In particular, a preferred method of operating a non-volatile memory cell includes the step of erasing the memory cell by withdrawing negative charge from a floating gate therein using a positive control electrode bias and a negative substrate bias. The use of a negative substrate bias increases the potential difference between the control electrode and the floating gate and this increase results in faster and more reliable erasing. The preferred method also includes the step of programming the memory cell by accumulating negative charge on the floating gate using a positive control electrode bias, a negative substrate bias and a positive drain bias. Here, the negative substrate bias is used advantageously to reduce the likelihood that non-selected memory cells will become inadvertently programmed during operations to program selected memory cells.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 5:
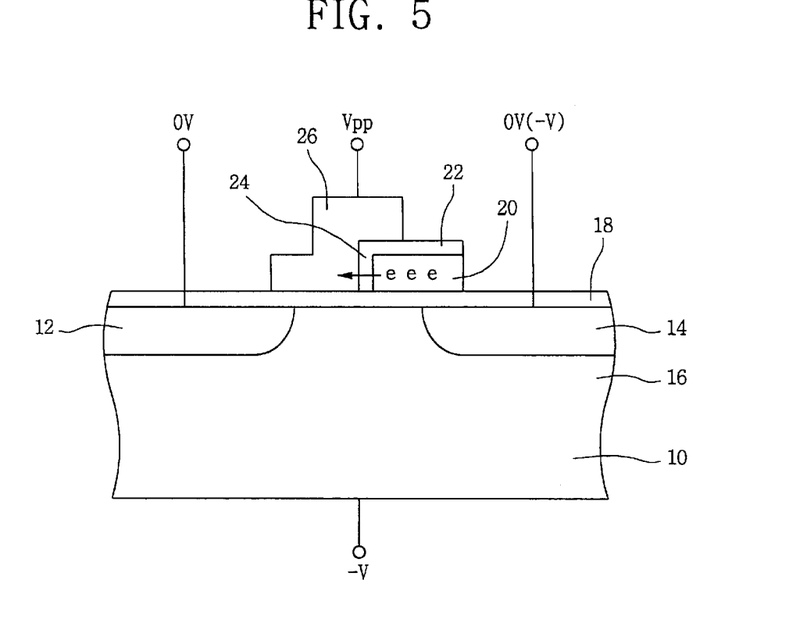
FIG. 5 illustrates a method of erasing a split gate type of non-volatile memory cell of the invention.

FIG. 5 illustrates a method of erasing the split gate type of non-volatile memory cell of FIG. 1. In the drawing, a high voltage Vpp is applied to a control gate 26; 0V to a source 12, 0V or −V to a drain 14, and −V to a substrate, thus performing the erasing operation.

The erasing operation is performed by electrons in a floating gate 20 which move toward a control gate 26 because of their voltage difference. To apply a high voltage to the control gate 26 and apply a negative voltage to the substrate 10, so that the voltage difference between the control gate 26 and the floating gate 20 is magnified in order to move the electrons in the floating gate 20 faster toward the control gate 26, thus improving the erasing rate.

Preferably, the drain 14 receives the same −V as the substrate 10 in order to decrease the voltage of the floating gate 20 so that the voltage difference between the floating gate 20 and the control gate 26 is magnified. The electrons in the floating gate 20, therefore, moves faster toward the control gate 26, thus effectively performing the erasing operation.

Accordingly, by decreasing the voltage of the floating gate fast during the erasing operation, the electrons can move fast from the floating gate to the control gate, thus solving the problem of raising the erasing threshold voltage of the cell due to the electron trapping phenomenon, at which electrons are trapped between the tunneling insulating layers. That is, with the thus-structured memory cell, we can solve the problem in the endurance characteristics.

Figure 8:
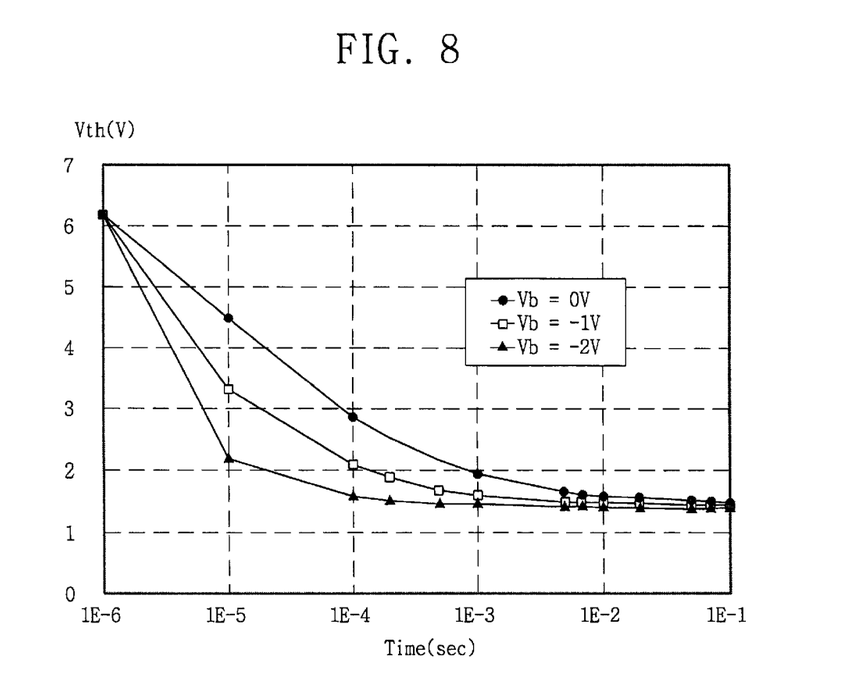
FIG. 8 is a graph showing the erasing rate with the variations of erasing threshold voltage versus time for the plate voltages.

FIG. 8 is a graph showing the erasing rate by the variation of the erasing threshold voltage versus time for the plate voltage. In the drawing, as the plate voltage (i.e., substrate voltage) is decreased from 0V to −1V or −2V, the reduction of the threshold voltage is increased with time, thus accelerating the erasing rate.

With this phenomenon, if the voltage applied to the floating gate 20 by decreasing the plate voltage during the erasing operation is defined with Vf, the voltage Vf is determined by the erasing voltage Vpp, negative plate voltage −V and the oxide capacitor surrounding the floating gate 20, and expressed in the following equation.

$$Vf = (Ctunnel/Ctotal) \times Vpp - V$$

$$Ctotal = Cdrain + Cchannel + Ctunnel$$

Here, Cdrain is a capacitor formed between the floating gate 20 and the drain 14; Cchannel is that between the floating gate 20 and the channel 16; Ctunnel in the tunneling insulating layer between the floating gate 20 and the control gate 26.

With the equation, we can know that the voltage difference between the floating gate 20 and the control gate 26 becomes bigger by decreasing the plate voltage so that the erasing operation can be performed fast.

That is, with the conventional erasing operation, the voltage Vf applied to the floating gate 20 is (Ctunnel/Ctotal) X Vpp and therefore a voltage lower than the voltage Vf obtained by the equation is applied to the floating gate 20. Consequently, the voltage difference between the floating gate 20 and the control gate 26 gets bigger, thereby performing the erasing operation fast.

Figure 9:
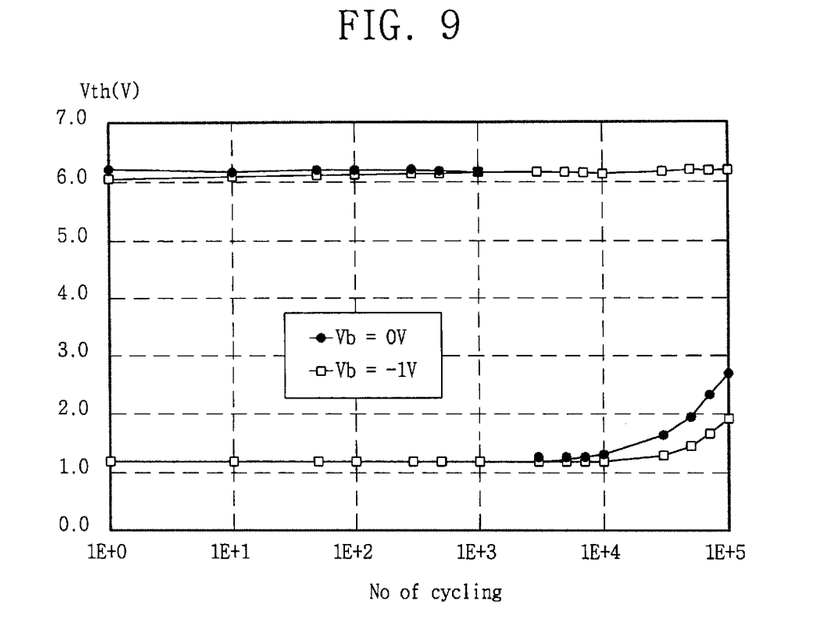
FIG. 9 is a graph showing the endurance characteristics of the program erase-repeat possible number for the plate voltages.

FIG. 9 is a graph illustrating the endurance characteristic in which the possible program erasing repeating number for the plate voltage.

FIG. 9 shows that as the plate voltage is decreased from 0V to −1V, the variation of the erasing threshold voltage is small.

Therefore, in the method of the invention, the variation of the erasing threshold voltage is so small that the number of repeating the program erasing operation can be increased, thereby enhancing the endurance characteristic.

Figure 6:
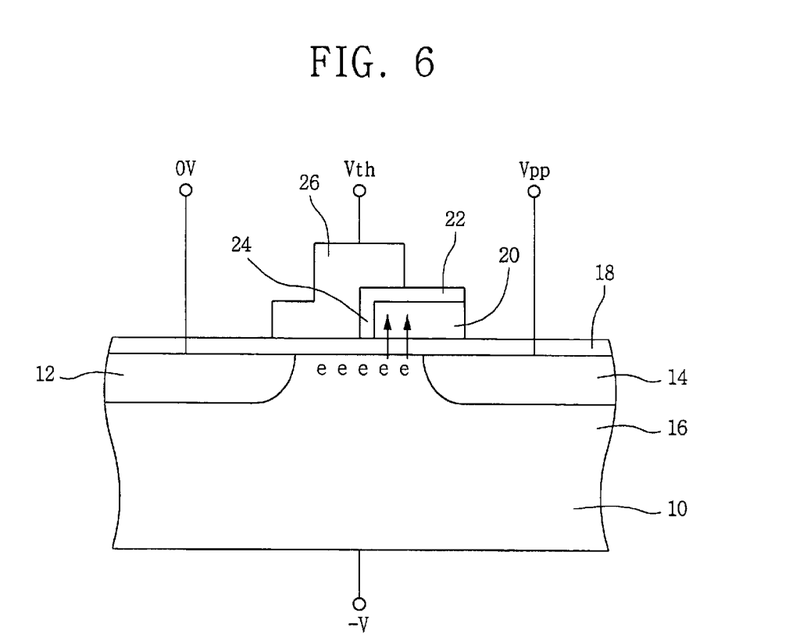
FIG. 6 illustrates a method of programming the split gate type of non-volatile memory cell of the invention.

FIG. 6 illustrates a method of programming the split gate type of non-volatile memory cell of the invention. The control gate 26 receives a threshold voltage Vth, the source receives 0V, the drain 14 receives a high voltage Vpp and the substrate 10 receives −V, thus performing the programming operation.

The programming operation is performed in the following sequence: electrons are applied to the channel region owing to the voltage difference between the source 12 and drain 14, and the electrons applied are traveled to the floating gate 20. This is to solve the program interference problem. That is, if the non-selected cell, which is commonly coupled with the drain of the selected cell, is in the erasing state, the plate voltage (i.e., substrate voltage) is decreased in order to reduce the floating gate, thus raising the threshold voltage of the non-selected erasing cell. Consequently, by removing the possible punch-through phenomenon in programming, we can prevent an On-cell from being programmed to an Off-cell. Hence, the program interference is solved.

Figure 10:
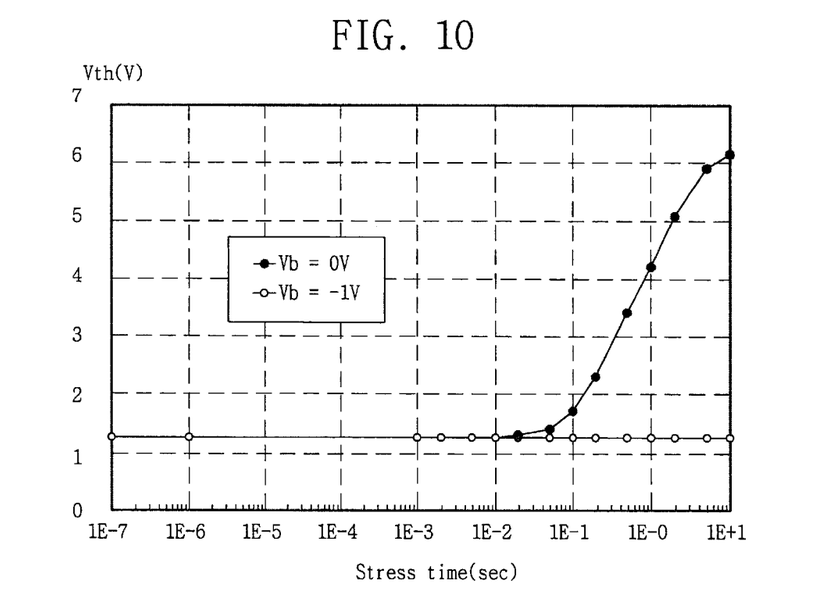
FIG. 10 is a graph showing the programming rate with the variations of a program threshold voltage versus time for the variation of the plate voltage.

FIG. 10 is a graph illustrating the program interference characteristic, by the variation of the non-selected erasing cell threshold voltage versus time for the variation of the plate voltage. In the drawing, we can know that the erasing threshold voltage is hardly varied with time by reducing the plate voltage during programming. That is, as the plate voltage is varied from 0V to −1V, the erasing threshold voltage of the non-selected erasing cell is hardly varied, but being constant. This is because during the programming, the punch-through of the non-selected cell is improved by reducing the plate voltage to thereby solve the problem of the program interference.

Figure 11:
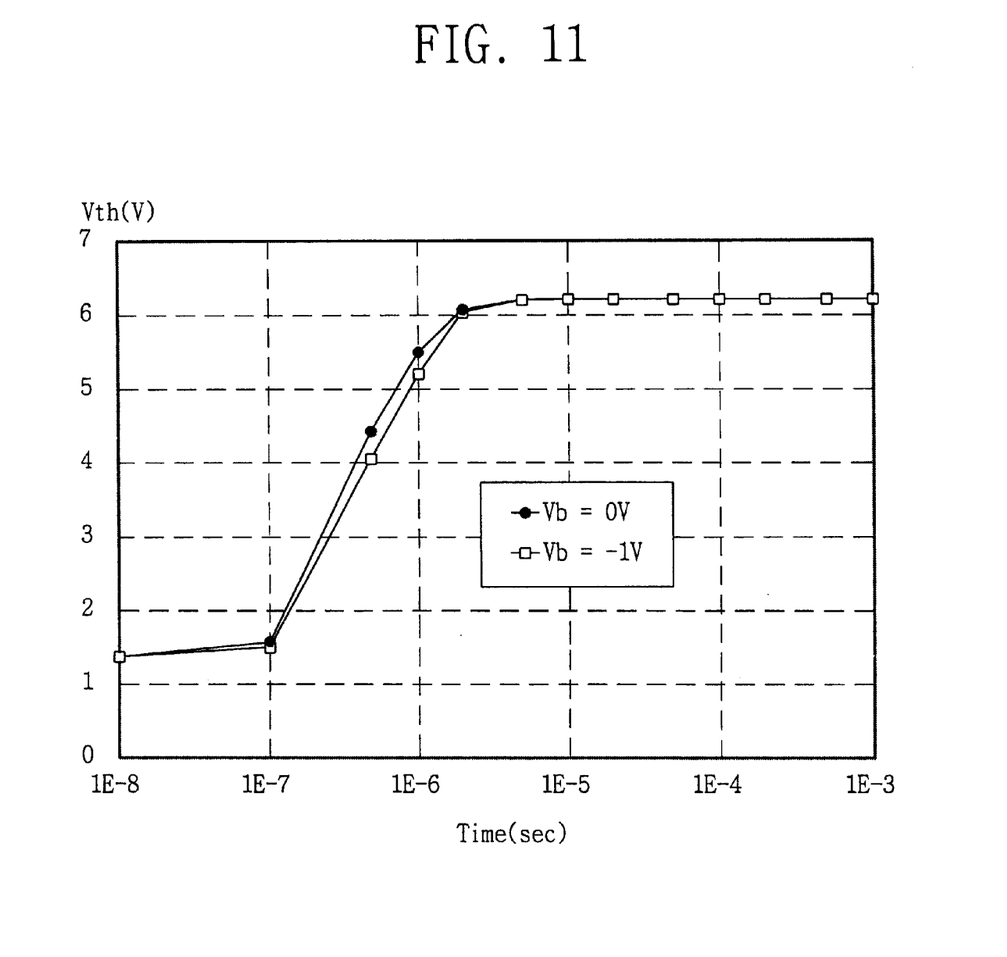
FIG. 11 is a graph showing the programming interference characteristics with the variations of a program threshold voltage versus time for the variation of the plate voltage.

FIG. 11 is a graph illustrating the programming rate during the programming operation by the variation of the threshold voltage versus time for the plate voltage. In the drawing, we can know that the variation of the threshold voltage as a function of time when the plate voltage is 0V or −1V is nearly the same, and therefore it does not affect on the programming rate.

Figure 7:
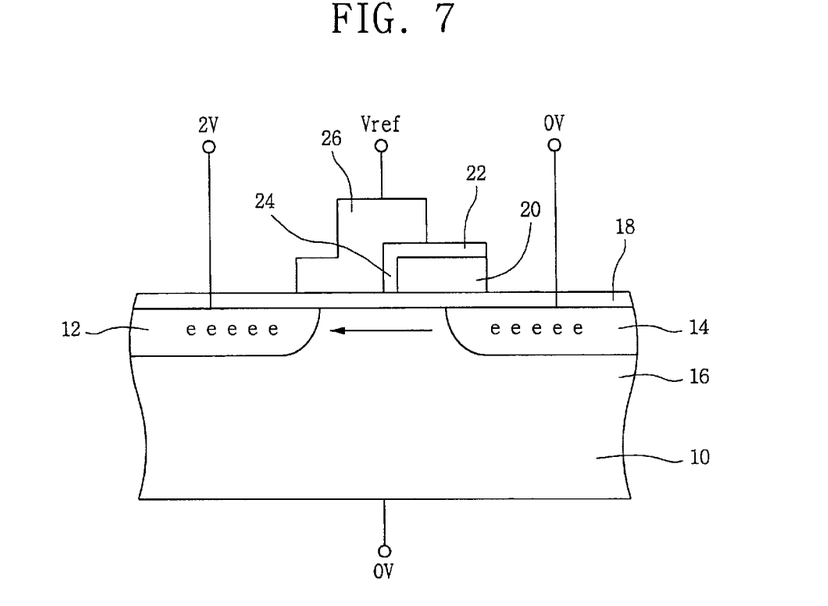
FIG. 7 illustrates a method of reading the split gate type of non-volatile memory cell of the invention.

FIG. 7 illustrates a method of reading the split gate type of non-volatile memory cell of the invention. The method is the same of FIG. 4.

The method of operating the split gate type of non-volatile memory cell of the invention will be described as follows. When programming, a negative voltage is applied to the substrate in order to remove the punch-through phenomenon and, therefore, solve the problem of program interference. And when erasing, a negative voltage is also applied to the source and drain to thereby prevent the increase of the threshold voltage owing to the electron trap phenomenon and improve the endurance characteristics.

Figure 12:
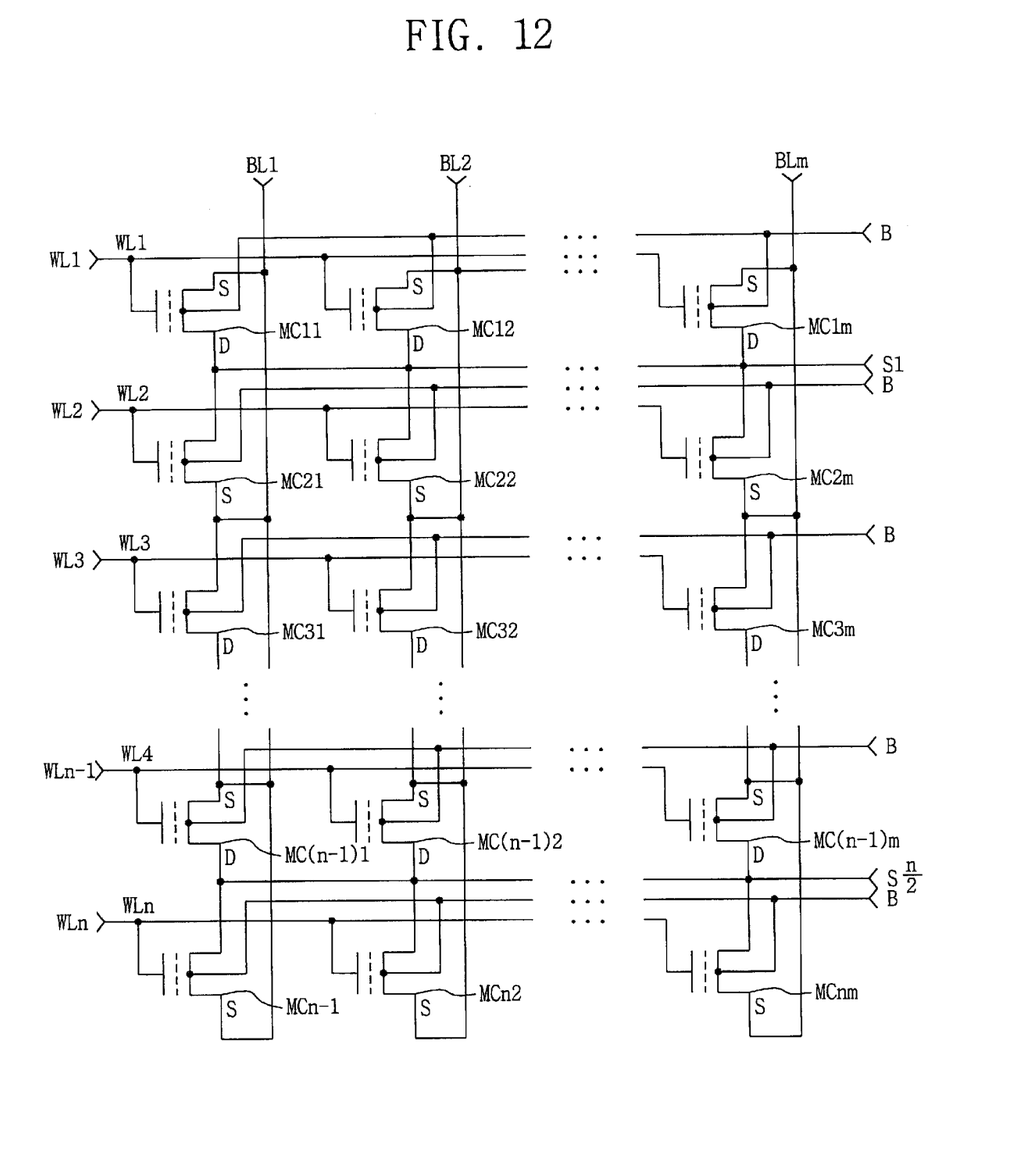
FIG. 12 illustrates a semiconductor memory device including the memory cells of FIG. 1.

FIG. 12 shows a semiconductor memory device having the split gate type of non-volatile memory cell of the invention. In the drawing, there are a plurality of memory cells MC11, MC12 . . . MCnm including n number of word lines WL1, WL2 . . . WLn, m number of bit lines BL1, BL2 . . . BLm, sources respectively connected to the M number of bit lines in parallel, and control gates respectively connected to the n number of word lines. Drains of the plurality of memory cells are commonly connected to each of common terminal S1, S2 . . . S(n/2) and the substrate of each one of the memory cells is commonly connected to the terminal B.

A method of operating the thus-structured semiconductor memory device is as follows.

An erasing operation is performed in such a manner that a high voltage is applied to each one of the n number of word lines; 0V is applied to each one of the m number of bit lines; −V is applied to the terminal B connected to the substrate; and 0V or −V is applied to the common terminal S.

As the erasing operation can be performed fast by magnifying the voltage difference between the floating gate and the control gate, it is better to apply −V to the common terminal S rather than 0V. The endurance characteristic is, therefore, improved.

Next, the programming operation of the memory cell MC11 is described as follows. A threshold voltage Vth is applied to the word line WL1 of the selected cell; 0V to the bit line BL1; A high voltage to the common terminal S1; −V to the terminal B; A threshold voltage to the word lines WL2 . . . WLn of the non-selected cell; power voltage to the bit line; and 0V to the common terminal S2 . . . S(n/2), thus performing the programming operation.

If the program is performed in the conventional method, an On-cell is programmed to an Off-cell in case the non-selected cell MC21 is erased. But, with the method of the invention, if negative voltage is applied to the substrate, even though the non-selected cell MC21 is erased, the punch-through is not generated and therefore the program interference problem is solved.

Finally, a reading operation of the memory cell MC11 will be described as follows. A reference voltage Vref is applied to the word line WL1 of the selected cell; a read voltage 2V to the bit line BL1; 0V to the common terminal S1; 0V to the terminal B; and 0V to the word lines WL2 . . . WLn, bit lines BL2 . . . BLm and common terminals S2 . . . S(n/2) of the non-selected cell.

As described above, with the method of operating the semiconductor memory device having the split gate type of non-volatile memory cells, the problems of the program interference and endurance characteristics are improved by applying negative voltage to the substrate during programming and to the substrate and drain during erasing. Therefore, with the above-method of the invention, we can enhance the reliability of the semiconductor memory device. In addition, the operating method of the invention is suited for the semiconductor memory device operating with a low power voltage.

It will be apparent to those skilled in the art that various modifications and variations can be made in the method of operating a split gate type of non-volatile memory cell and a semiconductor memory device having the cell of the present invention without departing from the spirit or scope of the invention. Thus, it is intended that the present invention cover the modifications and variations of this invention provided they come within the scope of the appended claims and their equivalents.

What is claimed is:

1. A method of operating a non-volatile split-gate type memory cell integrated within a semiconductor substrate, comprising the steps of:

erasing the memory cell by withdrawing negative charge from a floating gate therein using a positive control electrode bias and a negative substrate bias; and programming the memory cell by accumulating negative charge on the floating gate, using a positive control electrode bias, a negative substrate bias and a positive drain bias.

2. The method of claim 1, wherein a magnitude of the positive control bias used during the erasing step is greater than a magnitude of the positive control bias used during the programming step.

3. The method of claim 1, wherein said erasing step comprises applying a negative bias to a drain of the memory cell.

4. The method of claim 2, wherein said erasing step comprises applying a negative bias to a drain of the memory cell.

5. The method of claim 4, further comprising the step of reading the memory cell using a positive source-to-drain bias and a positive control electrode bias.

6. The method of claim 1, wherein said erasing step comprises applying a negative bias to a drain of the split-gate type memory cell and a negative bias to a source of the split-gate type memory cell.

* * * * *